United States Patent [19]

Sawae et al.

[11] 4,343,833

[45] Aug. 10, 1982

[54] METHOD OF MANUFACTURING THERMAL HEAD

[75] Inventors: Tetsunori Sawae; Hiromi Yamashita; Takafumi Endo; Toshio Tobita, all of Amagasaki, Japan

[73] Assignee: Mitsubishi Denki Kabushiki Kaisha, Tokyo, Japan

[21] Appl. No.: 160,572

[22] Filed: Jun. 17, 1980

[30] Foreign Application Priority Data

| | | | |
|---|---|---|---|
| Jun. 26, 1979 | [JP] | Japan | 54-82337 |
| Jun. 26, 1979 | [JP] | Japan | 54-82338 |
| Jul. 20, 1979 | [JP] | Japan | 54-93605 |
| Jul. 20, 1979 | [JP] | Japan | 54-93606 |

[51] Int. Cl.[3] ..................... H05K 3/06

[52] U.S. Cl. ..................... 427/96; 427/102; 427/103; 427/123; 427/126.2; 427/259; 427/260; 427/264; 427/265; 427/272; 427/282; 427/286; 427/404; 427/419.3; 156/659.1; 156/155; 156/230; 156/235; 156/239; 427/376.1; 427/376.2; 427/383.3; 427/388.1

[58] Field of Search ..................... 427/96, 102, 103, 123, 427/259, 260, 261, 264, 265, 266, 404, 419.3, 126.2, 272, 282, 286, 376.1, 376.2, 376.3, 379, 380, 383.3, 383.5, 388.1; 346/76 PH; 219/216; 156/659.1, 155, 230, 235, 239

[56] References Cited

U.S. PATENT DOCUMENTS

| | | | |
|---|---|---|---|
| 3,764,839 | 10/1973 | Fujimura | 346/76 PH |
| 3,801,880 | 4/1974 | Harada et al. | 427/96 |
| 3,852,563 | 12/1974 | Bohorquez et al. | 346/76 PH |
| 3,913,091 | 10/1975 | Aizawa et al. | 346/76 PH |
| 3,948,706 | 4/1976 | Schmeckenbecher | 427/272 |
| 3,984,844 | 10/1976 | Tanno et al. | 219/216 |
| 4,119,480 | 10/1978 | Nishi et al. | 427/96 |
| 4,204,187 | 5/1980 | Kakuhashi et al. | 427/96 |

OTHER PUBLICATIONS

Topfer, Thick Film Microelectronics, Van Nostrand Reinhold Co., N.Y. N.Y., 1971, pp. 28–31.

Towers, Hybrid Microcircuits, Pentech Press, London, 1977, pp. 45 and 133.

*Primary Examiner*—Norman Morgenstern

*Assistant Examiner*—Richard Bueker

*Attorney, Agent, or Firm*—Wenderoth, Lind & Ponack

[57] ABSTRACT

An organic coating with slits or holes in a predetermined pattern is disposed on the surface of an electrically insulating substrate on which electrode leads have been formed. A paste of an electrically resistive material fills the slits or holes and is dried at 120° to 140° C. The surface of the paste is flush with that of the coating after which the paste preliminarily baked in a stream of oxygen at 500° to 600° C. while the coating is burnt off. The paste is fully baked at 800° to 1000° C. to form a heating resistor elements.

4 Claims, 45 Drawing Figures

METHOD OF MANUFACTURING THERMAL HEAD

BACKGROUND OF THE INVENTION

This invention relates to a method of manufacturing a thermal head used for the purpose of heating thermally sensitive recording paper in facsimile apparatus, printers etc.

There are known thermal heads of the type comprising a plurality of electrode leads disposed alternately on both sides of an electrically insulating substrate and a ribbonshaped heating resistor bridging the electrode leads. During thermal recording, recording pulses are selectively applied to the electrode leads to generate heat from elements of the heating resistor interposed between the particular electrode leads. This heat is used to record visually information in accordance with the recording pulses on a section of thermally sensitive recording paper fed in opposed contact relationship to the thermal head.

One of the conventional methods of manufacturing such a thermal head has comprised the steps of screen printing a thick film paste of an electrically conductive material in predetermined regions on the surface of an electrically insulating substrate and baking the paste to form electrode leads. Then a thick film paste of electrically resistive material is printed into a ribbon bridging the electrode leads on the surface of the substrate through a stainless steel gauze or a screen having a predetermined width and baked at a predetermined temperature to form a heating resistor. Since the electrode leads are about a few micrometers thick, the heating resistor formed on the upper surfaces of the electrode leads and on the surface of the substrate has an irregular surface but not a uniformly flat surface. This has resulted in the unstable contact of the heating resistor with thermally sensitive recording paper. In other words, serious disadvantages have occured in that recorded dots have been uneven in density and more or less different in size from one another because recording dots are formed of the elements of the heating resistor interposed between the electrode leads and also the electric power required for the recording increases due to the deterioration of the thermal response of the thermal head.

Conventional methods of manufacturing the thick film type thermal head have used, as the screen, metal gauze with fine meshes formed of a fine stainless steel wire. In order to print the electrode leads or heating resistor in a predetermined pattern on the surface of the electrically insulating substrate, the screen has had a corresponding pattern formed thereon by a baking process. However, the dimension of the meshes and the diameter of the wire have lower limits. Therefore it has been practically impossible to form the leads and resistor in very fine patterns. Also since the paste of the electrically conductive or resistive material to be printed is passed through the fine meshes of the screen, the viscosity thereof should range from ten thousand to a hundred thousand centipoises. This has resulted in the blurring and flagging of the paste printed on the substrate. Therefore the resulting pattern has deteriorated in accuracy and accordingly the quality of the reproduced material has deteriorated.

Accordingly it is an object of the present invention to provide a new and improved method of manufacturing a thermal head by which heating resistors can be consistently formed in a predetermined configuration and the resulting resolution can be improved.

It is another object of the present invention to provide a new and improved method of manufacturing a thermal head including heating resistors which are small in size.

It is still another object of the present invention to provide a new and improved method of manufacturing a thermal head including heating resistors having improved flatness of the surface and which can effect high speed recording with reduced electric power.

It is a different object of the present invention to improve the thermal response of the thermal heads.

SUMMARY OF THE INVENTION

The present invention provides a method of manufacturing a thermal head comprising a first step of forming an organic coating having openings in the form of slits or holes in a predetermined pattern on an electrically insulating substrate, a second step of filling the openings on the coating with a thick film paste material, and a third step of baking the thick film paste material and burning off said coating.

BRIEF DESCRIPTION OF THE DRAWINGS

The present invention will become more readily apparent from the following detailed description taken in conjunction with the accompanying drawings in which.

FIG. *2a* is a fragmental perspective view of another conventional thermal head including a plurality of discrete heating resistors disposed in parallel relationship on the surface thereof;

FIG. *2b* is a fragmental perspective view of a record produced by the arrangement shown in FIG. *2a.*

Figure 5:
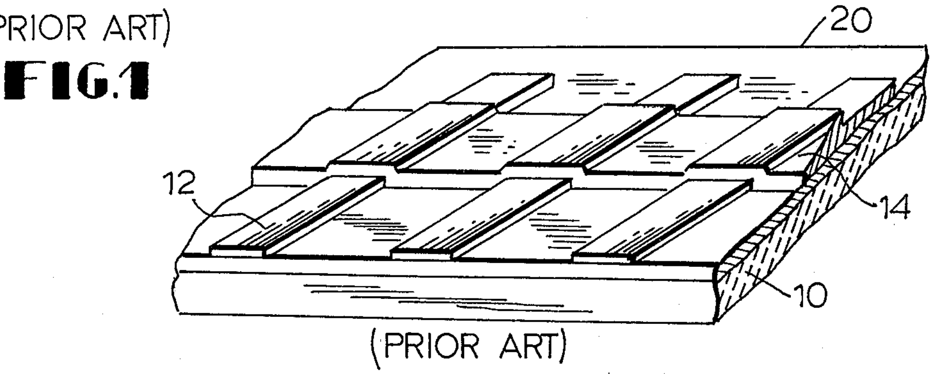
(PRIOR ART) FIG. 5
Figure 6:
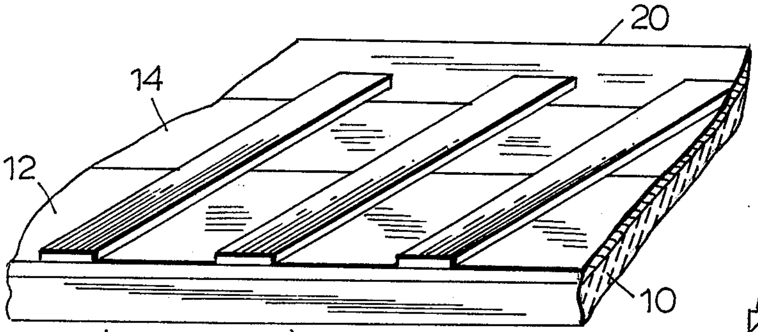
(PRIOR ART) FIG. 6
Figure 4:
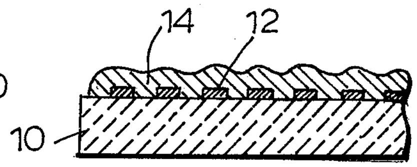
(PRIOR ART) FIG. 4
Figure 3:
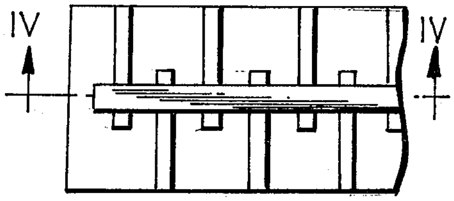
(PRIOR ART) FIG. 3

FIG. 3 is a fragmental plan view of still another conventional thermal head including a ribbon-shaped heating resistor disposed on the surface thereof;

FIG. 4 is a fragmental longitudinal sectional view taken along the line IV—IV of FIG. 3;

FIG. 5 is a fragmental perspective view of a conventional thick film type thermal head including a ribbon-shaped heating resistor disposed on the surface thereof;

FIG. 6 is a view similar to FIG. 5 but illustrating a conventional thin film type thermal head;

FIGS. *7a* through *7e* are longitudinal sectional view of the steps in the manufacture of a thermal head according to one embodiment of the method of the present invention;

FIG. *7f* is a perspective view of the thermal head manufactured by using the embodiment of the present invention shown in FIGS. *7a* through *7e;*

FIG. *7g* is a fragmental perspective view of a record produced by the arrangement shown in FIG. *7f;*

FIGS. *8a* through *8e* are fragmental longitudinal sectional views of the steps in the manufacture of a thermal head by a modification of the method of the present invention;

FIGS. *9a* through *9e* are views similar to FIGS. *8a* through *8e* but illustrating a modification of the modified method of the present invention shown in FIGS. *8a* through *8e;*

Figure 8A:
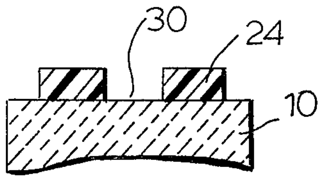
Figure 9A:
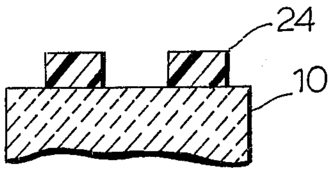
Figure 8B:
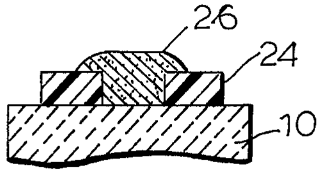
Figure 9B:
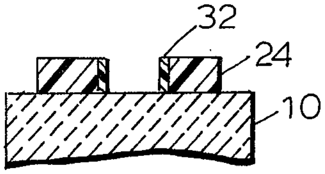
Figure 8C:
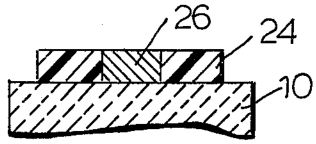
Figure 9C:
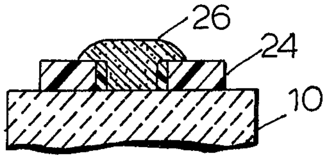
Figure 8D:
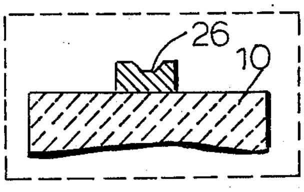
Figure 9D:
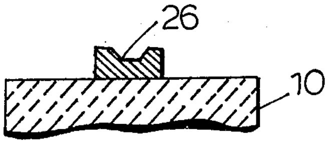
Figure 10:
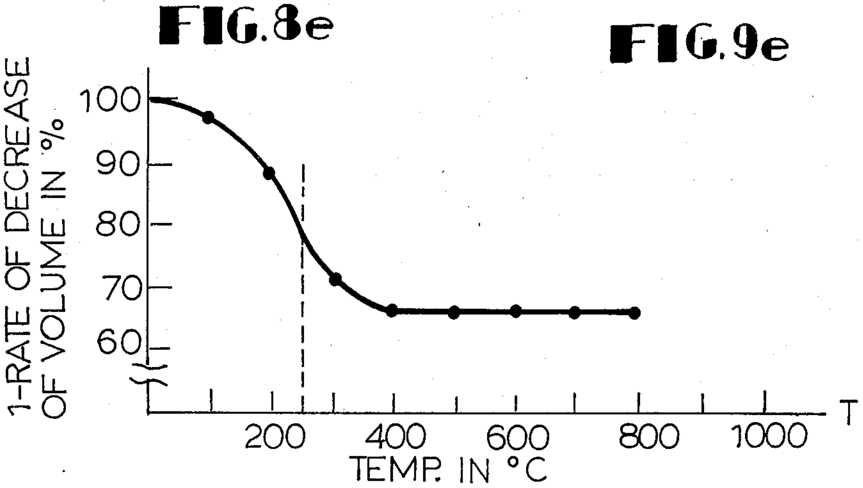
Figure 11:
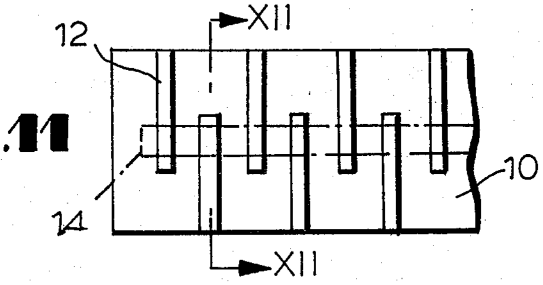
Figure 13A:
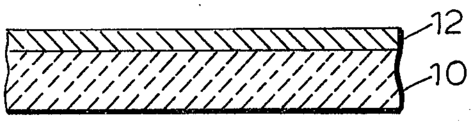
Figure 13B:
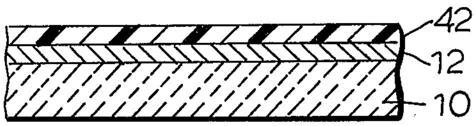
Figure 13C:
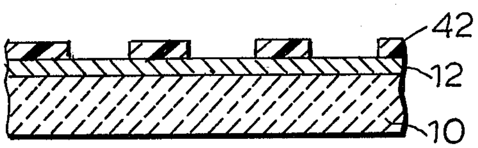
Figure 13D:
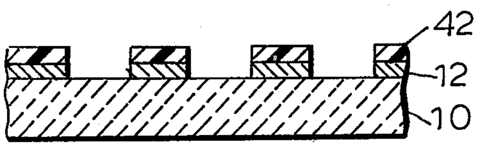
Figure 13E:
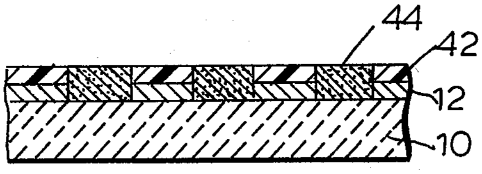
Figure 13F:
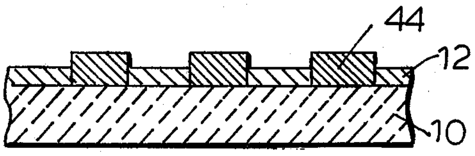
Figure 15:
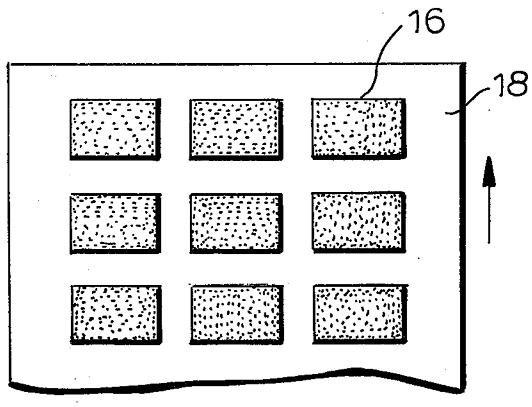
Figure 17:
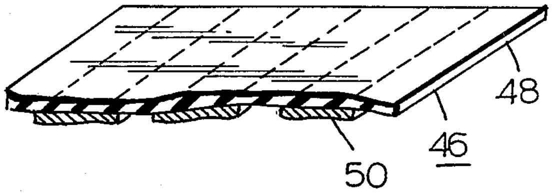
Figure 16:
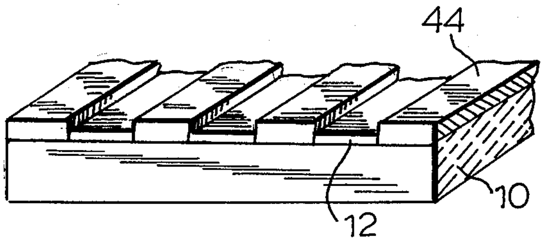
Figure 14A:
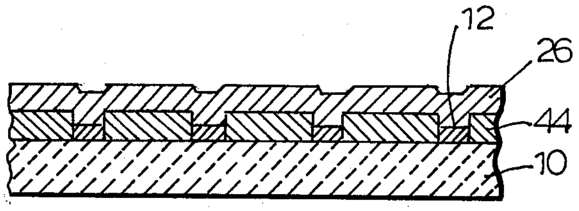
Figure 14C:
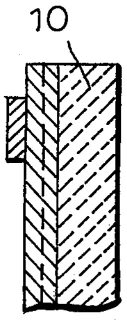
Figure 14B:
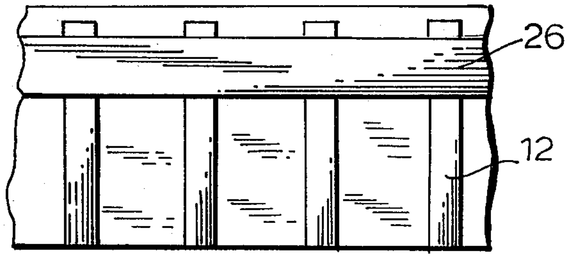

FIG. 10 is a graph useful in explaining the operation of the modified methods of the present invention shown in FIGS. 8*a* through 8*e* and FIGS. 9*a* through 9*e* respectively;

FIG. 11 is a fragmental plan view of a thermal head manufactured by another modification of the method of the present invention;

FIGS. 12*a* through 12*g* are longitudinal sectional views illustrating the successive manufacturing steps of a method of manufacturing the thermal head shown in FIG. 11 according to another modification of the present invention;

FIGS. 13*a* through 13*f* are fragmental longitudinal sectional views of the steps in the manufacture of a thermal head by still another modification of the method of the present invention;

FIG. 14*a* is a fragmental longitudinal sectional view of a thermal head manufactured according to the manufacturing steps shown in FIGS. 13*a* through 13*f*;

FIG. 14*b* is a fragmental plan view of the thermal head shown in FIG. 14*a*;

FIG. 14*c* is a cross sectional view of the thermal head shown in FIGS. 14*a* and 14*b*;

FIG. 15 is a fragmental plan view of a record produced by the arrangement shown in FIGS. 14*a*, 14*b* and 14*c*;

FIG. 16 is a fragmental perspective view of one portion of the side of the arrangement as shown in FIGS. 14*a*, 14*b* and 14*c* serving as a connection to an external circuit; and FIG. 17 is a fragmental perspective view of a flexible printed circuit for connecting the arrangement shown in FIGS. 14*a*, 14*b* and 14*c* to an external circuit.

Throughout the Figures like reference numerals designate the identical or corresponding conponents.

DESCRIPTION OF THE PREFERRED EMBODIMENTS

Conventional methods of manufacturing the thick film type thermal head have used the screen printer to print electrically conductive leads, a heating resistor or resistors and a wear resisting glass layer in the named order on an electrically insulating substrate so as to form predetermined patterns respectively. Those methods have used as the screen a metal gauze with fine meshes formed of a fine stainless steel wire. In order to screen print the electrically conductive leads or heating resistor or resistors in a predetermined pattern on the surface of the electrically insulating substrate, the screen has had a corresponding pattern formed thereon according a baking process. However the dimension of the meshes and the diameter of the wire have lower limits. Therefore where the heating resistor is formed into a very fine pattern of not greater than 200μ, on an electrically insulating substrate, the screen has been at least partly stuck to the resistor printed on the substrate resulting in the breaking of those portions of the screen wire attached to the resistor.

Figure 1:
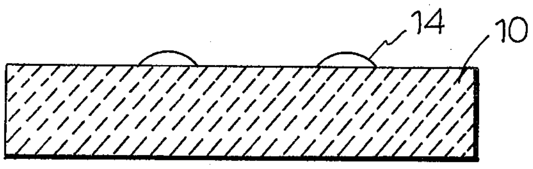
(PRIOR ART) FIG. 1
FIG. 1 is a fragmental longitudinal sectional view of a conventional thermal head including discrete heating resistors disposed in parallel relationship on the surface thereof.

Also since a paste for the leads or resistors to be printed is passed through fine meshes of the screen, the viscosity thereof should range from ten thousand to a hundred thousand centipoises. This has resulted in the blurring and flagging of the paste printed on the substrate. In FIG. 1, for example, a conventional thermal head is shown as comprising an electrically insulating substrate 10 and a pair of discrete heating resistors 14 with the cross section in the form of a segment of a circle disposed on the substrate 10. That cross section results from the blurring and flagging of the paste for the resistor as described above and greatly reduces the accuracy of the resulting pattern.

Figure 2A:
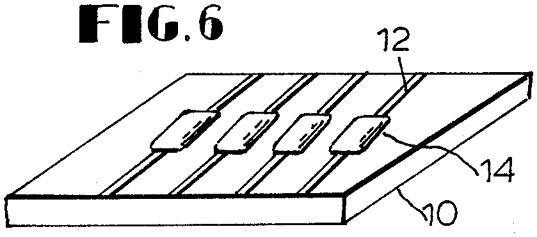
(PRIOR ART) FIG. 2a

Also another thermal head shown in FIG. 2*a* has been manufactured as described above and comprises an electrically insulating substrate 10, a plurality of electrode leads disposed on the surface of the substrate 10 extending in opposite directions toward each other from both sides of the substrate 10 and a heating resistor 14 bridging each pair of opposed leads 12 on the surface of the substrate 10.

In FIG. 2*a* each of the heating resistors 14 has a profile defined fairly well but a crowned surface resulting in the print accuracy being bad.

Figure 2B:
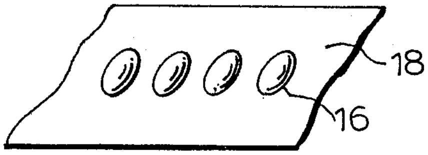
(PRIOR ART) FIG. 2b
Figure 7A:
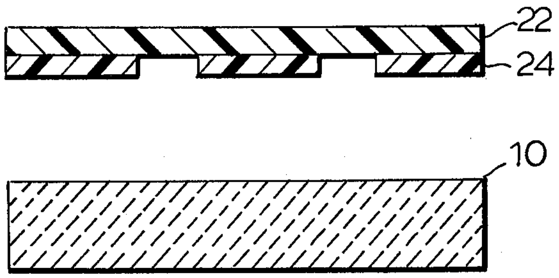
Figure 7E:
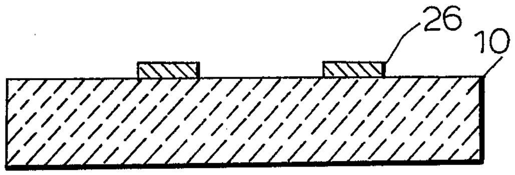
Figure 7B:
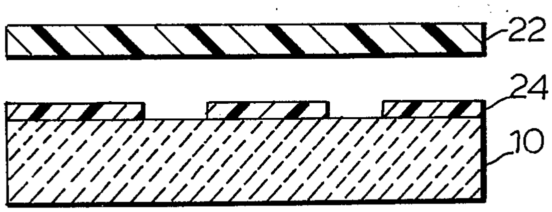
Figure 7F:
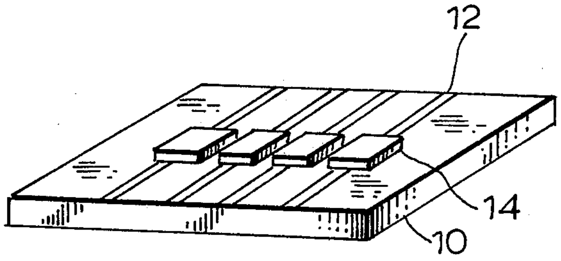
Figure 7C:
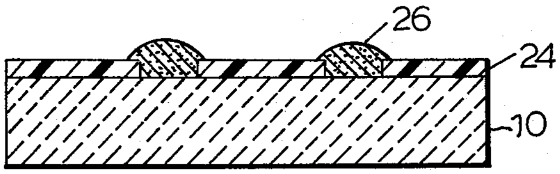
Figure 7G:
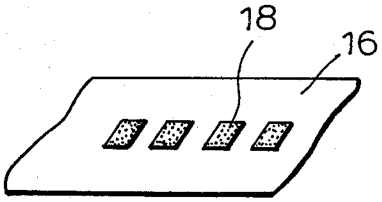
Figure 7D:
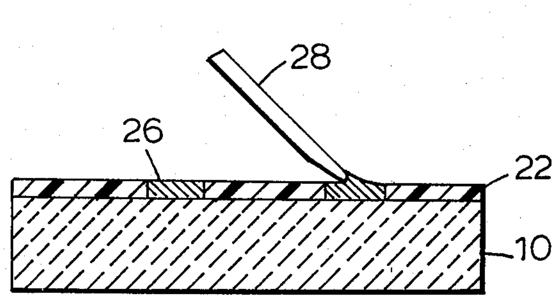

FIG. 2*b* shows visual dots 16 recorded on a section of thermally sensitive recording paper 18 put in contact with the heating resistors 14 in the arrangement of FIG. 2*a* by applying recording pulses across the pairs of electrode leads 12 to generate heat from the mating resistors 14. As shown in FIG. 2*b*, each of the recorded dots 16 has a density which is high in the central portion and gradually decreased toward its periphery. In other words, the recorded dots 18 decrease in quality.

FIGS. 3 and 4 show still another conventional thermal head. The arrangement illustrated comprises a substrate 10 of electrically insulating material, for example, a ceramic material, a plurality of electrode leads 12 disposed alternately along both sides of the top surface of the substrate 10 and a ribbon-shaped heating resistor 14 disposed on the surface of the substrate 10 and bridging the electrode leads 12.

At the time of thermal recording, recording pulses are selectively applied across the electrode leads 12 on one side of the substrate 10 and adjacent ones of the electrode leads 12 on the other side thereof to generate heat from elements of the heating resistor 14 interposed between the electrode leads 12 to which the recording pulses have been applied. This heat is used to form recorded dots in accordance with the recording pulses on a section of thermally sensitive paper (not shown) contacting the elements of the heating resistor 14.

One of conventional methods of manufacturing the thermal head as shown in FIGS. 3 and 4 has comprised the steps of screen printing a thick film paste of an electrically conductive material in predetermined regions on the surface of the substrate 10 and baking the paste to form the electrode leads 12. Then a thick film paste of an electrically resistive material is screen printed in a predetermined region on the surface of the substrate to bridge the electrode leads 12 and baked at a predetermined temperature to form a ribbon-shaped heating resistor 14.

According to the method as described above, however, the electrode leads 12 disposed on the substrate 10 are about a few micrometers (μm) thick. Thus the ribbon-shaped heating resistor 14 disposed on the upper surface of the electrode leads 12 and on the surface of the substrate 10 as described above has an irregular surface rather than a uniform flat surface. That irregular surface causes the heat resistor elements to be unstably contacted by the thermal sensitive recording paper. In other words, serious disadvantages have occured in that recorded dots are uneven in density and more or less different in size from one another because recording dots are formed of the heating resistor elements interposed between the electrode leads and also the electric power required for recording increases due to the deterioration of the thermal response of the thermal head.

Furthermore thermal heads of the type referred to and more particularly line scanning type thermal heads include, in many cases, the heating resistor elements and lead terminals therefor whose configurations are generally typical of the thick film type as shown in FIG. 5 or the thin film type as shown in FIG. 6.

In the thick film type of thermal heads of the type referred to, a screen printing technique is used to print an electrically insulating layer 20 for thermal isolation, electrode leads 12 and a heating resistor layer 14 are printed on an electrically insulating substrate 10 in the named order followed by the baking. Finally the assembly thus formed is coated with a wear resisting layer (not shown in FIG. 5).

In the thin film type thermal head, sputtering technique or any other thin film forming technique well known in the art is used to form the heating resistor layer 14 on the surface of the substrate 10 and normally below the electrode leads 12 as shown in FIG. 6. In this respect the thin film type is different from the thick film type.

The arrangements shown in FIGS. 5 and 6 are characterized in that the heating resistor elements interposed between the electrode leads have a lower level than the electrode leads where heat is not generated.

Upon printing the recording dots, if a section of thermally sensitive recording paper is more intimately contacted by the heating resistor elements, a larger quality of thermal energy generated from the heating resistor elements is transmitted to the section of the recording paper. However the arrangements shown in FIGS. 5 and 6 include the heating resistor elements located in recesses formed in the surface thereof resulting in the formation of gaps between the section of the thermally sensitive recording paper and the outer surface of the heating resistor elements. This means that the efficiency of thermal transmission is poor. Accordingly in order to give the recorded areas of the thermally sensitive recording paper the required density, it is required to apply additional thermal energy to the recording paper sufficient compensate for the heat loss due to the poor contact between the paper and heating resistor elements resulting from the gap formed therebetween.

Also the electrode leads 12 can be connected to an external circuit through a flexible connector put in compressible contact therewith. At that time if the number of the electrode leads per unit length increases, the circuit might shortcircuit and be at least partly disconnected.

In order to eliminate the disadvantages of the prior art practice as described above, the present invention aims at the provision of a high quality thermal head by disposing an organic coating with slits or holes in a predetermined pattern on an electrically insulating substrate and filling the slits or holes with a paste of electrically resistive material thereby to form uniform heating resistor elements which increases the print accuracy and quality.

While the present invention will now be illustrated and described in conjunction with the formation of heating resistor elements on an electrically insulating substrate, because the invention is particularly suitable for forming such resistor elements it is to be understood that it is equally applicable to the formation of other electric components, for example, electrode leads on an electrically insulating substrate. In the examples illustrated hereinafter, it is assumed that electrode leads have been preliminarily disposed on predetermined portions of the surface of an electrically insulating substrate by a sputtering technique or any other thin film forming technique well known in the art. However such electrode leads are not illustrated in the following Figures except for those showing the completed thermal heads.

Therefore the present invention will be described hereinafter as being to form the heating resistor elements on the surface of an electrically insulating substrate having the electrode leads preliminarily disposed thereon.

FIGS. *7a* through *7e* show one embodiment of a method of manufacturing a thermal head and more particularly heating resistor elements according to the present invention in the order of the manufacturing steps thereof. In FIG. *7a*, a supporting film 22 is shown as being disposed above a substrate 10 of electrically insulating material such as a ceramic material spaced in parallel relationship from the latter and having a viscous coating 24 of any suitable organic material with a substantially uniform thickness disposed on one of the surfaces, in this case, the lower surface as viewed in FIG. *7a* of the supporting film 22. The coating 24 includes openings such as holes or slits formed in a predetermined pattern thereon by pressing, cutting, photoengraving techniques or the like.

The viscous coating 24 is transferred to that surface of the substrate 10 opposed to the supporting film 22 as shown in FIG. *7b*.

For thin coatings, the coating 24 is formed on the film 22 composed of a film material having good dimensional stability, for example Mylar (trade mark) or polyethylene glycol terephthalate film and the film 22 is peeled off from the coating 22 after it has been transferred to the substrate 10. Alternatively the coating may be formed on a piece of paper coated with a parting agent and the piece of paper is peeled off from the coating after the transfer of the latter.

Then a printer or a rubber pallet is used to fill lightly the holes or slits in the coating 24 with a thick film paste 26 of a heating resistor material as shown in FIG. *7c* although the printer or rubber pallet is not illustrated.

Following this the paste is dried at a temperature of from 120° to 140° C. and an organic solvent included therein is vaporized. At that time, a metallic blade or rubber pallet 28 is used to remove lightly those portions of the paste 26 extending above the surface of the coating 24 as shown in FIG. *7d*. Thereby the surface of the paste 26 filling the slits or holes is substantially flush with the surface of the coating 22. That is, the paste portions filling the slits or holes become equal in thickness to one another.

Subsequently the printed substrate 10 with the coating 24 thus treated is heated at a temperature of from about 500° to about 600° C. within a stream of oxygen to burn down the organic coating 24 without leaving any ashes.

Then the substrate with the pre-baked paste 26 is heated to a baking temperature of from 800° to 1000° C. for the paste 26 resulting in the full baking of the paste.

The resulting structure is shown in FIG. *7e*. As shown in FIG. *7e*, the heating resistor elements formed of the fully baked paste 26 have flat surfaces flush with each other and peripheries defined sharply in contrast to the heating resistors 14 shown in FIG. 1 having blurred and flagged peripheries.

FIG. *7f* shows a thermal head comprising four heating resistor elements 14 formed on the surface of the substrate 10 in the manner as described above and four pairs of opposite electrode leads 12 disposed on the surface of the substrate 10 with adjacent ends of leads connected to the respective elements of the heating resistor 14.

The configuration of the baked paste 26 as described above in conjunction with FIG. *7e* greatly effects the shapes of dots printed or recorded on a section of thermally sensitive recording paper by the thermal head shown in FIG. *7f*. As shown in FIG. *7g*, the resulting dots 16 recorded on the section of recording paper 18 have well defined profiles and the contrast between the recorded portions of the paper section and the remaining portion thereof is improved.

The method of the present invention as described above in conjunction with FIGS. *7a* through *7e* is advantageous in that the slits or holes can be formed in a fine pattern on the organic film as compared with direct printing processes previously employed resulting in the recording of dots in a fine pattern. Also thick film type thermal heads manufactured by the present invention are high in resolution as compared with the prior art practice. This is because the heating resistor elements have the density ranging from 6 to 10 dots per 1 mm.

In the embodiment of the present invention shown in FIGS. *7a* through *7e* bubbles may be formed on the surface of the heating resistor elements and also combustion products may be left on that surface resulting in irregular surfaces of the resistor elements. This is because the paste of the heating resistor 26 has a high adhesion coefficient relative to the organic coating 24, the paste unstably decreases in volume due to the vaporization of the organic solvent included therein, an organic binder included in the paste is unstably burnt in the step of fully baking the paste and so on.

The present invention also comtemplates to eliminate this objection in a manner which now be described in conjunction with FIGS. 8*a* through 8*e*. First an organic coating 24 is attached to the surface of a substrate 10 electrically insulating material, such as a ceramic material such as by applying heat and pressure thereto to have a uniform thickness except for predetermined portions 30 of the surface where heating resistor elements are to be formed in a later step.

The resulting structure is shown in FIG. 8*a*.

Then the process as described above in conjunction with FIG. *7c* is repeated to form the arrangement illustrated in FIG. 8*b* after which the process as described above in junction with FIG. *7d* is repeated followed by drying.

The resulting structure is shown in FIG. 8*c*.

The arrangement of FIG. 8*c* is put in an atmosphere where the air forcedly circulates and is heated to a maximum temperature not higher than a softening point of a glass frit included in the paste 26 with a slow rate or rise of temperature ranging from 10° to 20° C. per minute. This results in the preliminary baking of the paste during which organic binders included in the organic coating 24 and the paste 26 are vaporized and burnt until the heating resistor elements 14 are formed (see FIG. 8*d*).

Subsequently and preliminarily baked resistor elements are fully baked at a temperature of about 900° C.

Figure 8E:
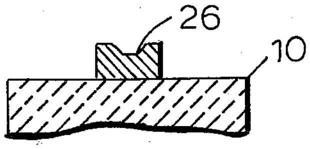
Figure 9E:
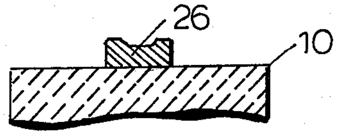

The resulting arrangement is shown in FIG. 8*e*.

When dried and baked, thick film pastes usually employed decrease in volume following a curve such as shown in FIG. 10 wherein one (1) minus a rate of decrease of volume of a thick film paste in percent is plotted on the ordinate against the temperature on the degrees centigrate in absissa with the rate of rise of temperature kept at 10° C. per minute.

More specifically, the paste 26 of the heating resistor includes generally an organic solvent of the butyl carbitol (trade mark) system and an organic binder of the ethyl cellulose system. Such an organic solvent is vaporized at a temperature of from 100° to 200° C. resulting in a slow decrease in volume of the paste while the organic binder is burnt at a temperature of from 300° to 400° C. resulting in the volume of the paste suddenly decreasing to from 60 to 70% of the initial magnitude as shown in FIG. 10. Also a glass frit included in the paste starts to be softened at a temperature of from 500° to 700° C. Therefore the paste being baked hardly decreases in volume at a temperature in excess of about 400° C. as shown in FIG. 10.

From the foregoing it is seen that the step of preliminarily baking the paste (see FIG. 8*d*) is effective for preventing both the vaporization of the organic solvent included in the paste and the burning of the organic binder included therein from being suddenly effected. Accordingly, the surface of the heat resistor elements which has been having combustion products stuck thereto resulting in good sticking combustion products thereto resulting in the good flatness.

The resulting heating resistor elements do not have a perfectly flat surface as shown in FIG. *7e* and their surface is more or less irregular as shown exaggratedly in FIGS. 8*d* and 8*e*. It has been found that the heating resistor elements manufactured by the present invention have a surface with greatly decreased irregularity as compared with the prior art practice. In this sense, it is said that good flatness results.

Further the preliminary baking step shown in 8*d* is effective for eliminating an objection due to a high adhesion coefficient with which the organic coating contact the adjacent portions of the thick film paste. In order to eliminate more effectively that objection, a viscous material may be applied to wall portions of openings or windows or the organic coating defining regions of the thick film paste after the coating has been attached to the substract.

More specifically, the organic coating 24 is attached to the substrate 10 as shown in FIG. 9*a* and then a viscous material 32 in the form of a thin film is disposed on a wall portion of each of the openings in the coating 24 as shown in FIG. 9*b*. Thereafter the steps shown in FIGS. 8*b* through 8*e* are successively repeated to form the arrangement shown in FIG. 9*e*. FIGS. 9*c* and 9*d* correspond to FIGS. 8*b* and 8*d* respectively but there is not illustrated the arrangement corresponding to that shown in FIG. 8*c*.

It is to be understood that the viscous material may be applied to the entire area of the surface of the organic coating and substrate.

FIG. 11 shows a thermal head manufactured by still another modification of the present invention although the heating resistor 14 is shown in broken lines as bridging the electrode leads 12 on the surface of the substrate 10.

As shown in FIG. 11, a plurality of electrode leads 12 are disposed to extend inwardly alternately from both side edges of the surface of the ceramic substrate 10 in parallel relationship at equal intervals so that the electrode leads 12 extending from one side of the substrate 10 overlap in spaced relationship those extending from the other side thereof. The electrode leads 12 are formed by screen printing a thick film paste of electrically conductive material on those portions of the surface of the substrate defined for the electrode leads and baking the paste.

Figure 12A:
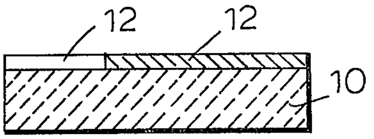

The resulting structure is also shown in FIG. 12*a* where the arrangement of FIG. 11 is illustrated in cross section taken along the line XII—XII of FIG. 11.

Then a first organic coating 34 is attached to the surface of the substrate 10 including the electrode leads 12 in the manner as described above in conjunction with FIG. 8*a* (see FIG. 12*a*).

Figure 12B:
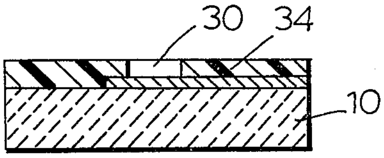
Figure 12C:
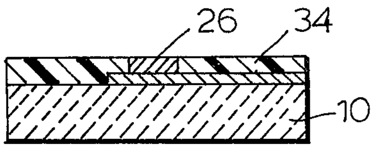

Then the arrangement of FIG. 12*a* is successively treated as described above in conjunction with FIGS. 8*b* and 8*c* to form the arrangement shown in FIG. 12*c*.

Figure 12D:
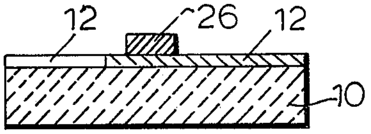
Figure 12E:
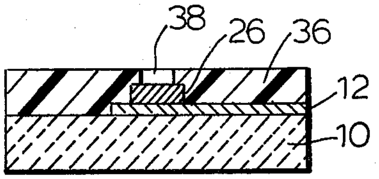

Subsequently the arrangement of FIG. 12*c* is treated in the same manner as described above in conjunction with FIGS. 8*d* and 8*e* to form a first heating resistor 26 in the form of a layer on the surface of the substrate 10 as shown in FIG. 12*d*.

Figure 12F:
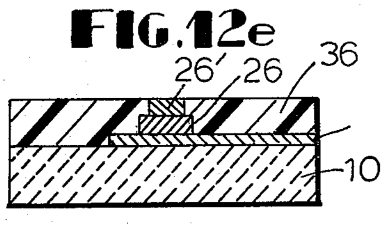
Figure 12G:
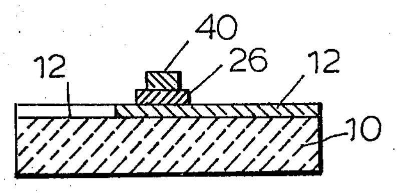

Following this a second organic coating 36 is attached to the surface of the substrate by repeating the process as described above in conjunction with FIG. 12*b* or 8*a*. In this case the coating 36 covers both longitudinal edge portions of the first heat resistor 26 so that the latter has the exposed surface 38 narrower than the entire surface thereof. Then the processes as described above in conjunction with FIGS. 12*c* and 12*d* or FIGS. 8*c*, 8*d* and 8*e* are successively repeated resulting in the arrangement shown in FIG. 12*g*. FIG. 12*f* corresponds to FIG. 12*c*.

As shown in FIG. 12*f*, the resulting heating resistor assembly includes the first heating resistor 26 and a second heating resistor 40 disposed on and narrower than the first resistor 26.

From the foregoing it will readily be understood that, as the paste of the heating resistor fills the openings defined in the organic coating to form a layer with a uniform thickness, the resulting heat resistor assembly is not affected by the thickness of the electrode leads. Therefore the resulting heating resistor elements have their surfaces substantially flush with one another to form a distinct dot pattern without deviation in dimension. Also in a double layer structure, the heating resistor assembly has a thermal conductivity capable of being controlled over a wide range. Therefore the optimum thermal response can readily be imparted to the resulting thermal head.

While sheet resistances of the first and second heating resistors have not been particularly specified in FIGS. 12*a* through 12*g* it has been found that if first heating resistor 26 has a higher sheet resistance than the second heating resistor, this will improve the thermal response of the resulting thermal head resulting in recorded dots being distinct with less electric power required for recording.

The present invention has been described starting with the electrode leads formed on the surface of an electrically insulating substrate by screen printing a paste of an electrically conductive material in a predetermined pattern on the surface thereof and in conjunction with FIGS. 12*a* through 12*g*. However it is to be understood that the present invention is equally applicable to form first electrode leads and then heating resistor elements on the surface of an electrically insulating substrate.

As shown in FIG. 13*a* a substrate 10 formed, in this case of an alumina-ceramic material is coated with a layer of electrically conductive material 12. For the thick film type, a paste including silver-palladium (Ag-Pd) mixture, copper (Cu), gold (Au) or platinum (Pt) is disposed in the form of a layer on the surface of the substrate 10. Then the paste is required to be sintered at a baking temperature thereof. Also for the thin film type, a metal selected from among copper (Cu), gold (Au), nickel (Ni) etc. is disposed on the surface of the substrate by a vacuum evaporation or sputtering technique.

Then a photoresist coats the electrically conductive layer 12 to form a film 42 with a thickness of from 10 to 30 microns (see FIG. 13*b*). Alternatively, a photoresist in the form of a film 42 may be adhered to the surface of the substrate 10.

Then the film of photoresist 42 is selectively etched off by a photoengraving technique to leave the film 42 in a predetermined pattern required for electrode leads to be formed in the later step.

The resulting structure is shown in FIG. 13*c*.

Alternatively it is possible to stick any suitable organic coating which is burnt off at from 300° to 500° C. to the substrate in place of the photoresist and to remove unnecessary portions of the coating mechanically or with optical energy due by a laser or the like.

Following this, a chemical etching process is used to etch off those portions of the electrically conductive layer 12 not overlaid with the photoresist film 42 or organic coating as shown in FIG. 13*d*. This results in the formation of the electrode leads 12.

Subsequently a screen printing process, a rubber pallet or a squeezee is used to charge recesses formed on the surface of the substrate through the selective etching of the electrically conductive layer 12 with a thick film paste 44 of an electrically insulating material having a thermal isolation effect following by drying.

Then surplus portions of the paste 44 adhering to the surface of the photoresist film or organic coating 42 are removed by a metallic pallet or the like so that the surfaces of the paste portions filling the recesses are flush with the surface of the film or coating 42.

The resulting structure is shown in FIG. 13*e*.

Subsequently the photoresist film or organic coating 42 as shown in FIG. 13*e* is burnt off within a baking furnace at a temperature of from 300° to 500° C. after which the electrically insulating paste 44 is fully baked at a baking temperature of from 800° to 1000° C. suitable therefor. This results in the formation of a compound electrically insulating substrate including a plurality of electrode leads 12 interposed between and having a surface level lower than the baked insulating paste portions 44 as shown in FIG. 13*f*.

It will readily be understood that the baked insulating paste portions 44 have the same thickness controlled by that of the photoresist film or organic coating 42.

Following this, the heating resistor 14 is disposed on the surface of the substrate thus formed to bridge the electrode leads 12 according to the various embodiments of the present invention as described above, for example the manufacturing method shown in FIGS. 12*b* through 12*d*.

The resulting structure is shown in longitudinal section, plan and cross section in FIGS. 14*a*, 14*b* and 14*c* respectively. As best shown in FIG. 14*c* the heat resistor 14 in the form of a layer protrudes beyond the surface of the compound substrate while heating resistor elements interposed between the electrode leads 12 are raised from the remaining portion thereof and include surfaces substantially flush with each other.

FIG. 15 shows dots 16 recorded on a section of thermally sensitive recording paper 18 by the arrangement as shown in FIGS. 14*a*, 14*b* and 14*c* contacted by the section of recording paper 18 and energized as described above while the section of paper 18 is moved stepwise in the direction of the arrow illustrated in FIG. 15.

From FIG. 15 it is seen that because of the above described structure of the arrangement illustrated, the recorded dots 16 are substantially identical in density to one another and each of the dots 16 is well separated from the adjacent dots 16 resulting in high resolution.

The arrangement shown in FIGS. 14*a*, 14*b* and 14*c* is advantageous in that its thermal efficiency is high because the surface of the electrode leads is lower than that of the thermally isolating electrically insulating layer.

As shown in best in FIG. 16, the arrangement shown in FIGS. 14*a*, 14*b* and 14*c* includes an edge portion on which the thermally isolating, electrically insulating portions 44 are raised between the electrode leads 12. The edge portion can be put in compressible contact with a flexible printed connector such as shown in FIG. 17. FIG. 17 shows a flexible printed connector 46 including a flexible electrically insulating layer 48 and a plurality of connecting leads 50 disposed on one of the surfaces, in this case, the lower surface as viewed in FIG. 17 of the layer 48 at their positions where the connecting leads 50 are put in intimate contact with the respective electrode leads 12 while being sandwiched between the adjacent insulating portions 44.

Therefore the flexible printed contactor 46 can easily be connected to the electrode leads 12 without a short-circuit or a disconnection occurring in an associated circuit due to erroneous connections.

From the foregoing it is seen that the method of the present invention can manufacture a thermal head including heating resistor elements having their surfaces substantially flush with one another and excellent flatness resulting in good recorded dots.

While the present invention has been illustrated and described in conjunction with a few preferred embodiments thereof it is to be understood that numerous changes and modifications may be resorted to without departing from the spirit and scope of the present invention. For example, in order to prevent the heating resistor elements from wearing and tearing due to a section of thermally sensitive recording paper sliding along the heating resistor elements, a wear resisting layer may be disposed on the heating resistor. Further the surface of the wear resisting layer may be polished to make the smoothness of the surface more uniform.

What is claim is:

1. A method of manufacturing a thermal head, comprising the steps of:

attaching a plurality of electrically conductive strips on a surface of an electrically insulating substrate;

providing viscous organic coating on a supporting film and forming at least one opening of predetermined shape in said coating;

applying said viscous organic coating having said opening to said surface of the substrate which has attached thereon said electrically conductive strips with said opening over at least part of said strips, and removing said supporting film and leaving said viscous organic coating on said substrate;

filling said opening with a thick film paste material including an electrically resistive material;

heating said viscous organic coating and said thick film paste material, thereby burning and removing said viscous organic coating and sintering and converting said thick film paste material into a resistive heater;

forming at least one second opening in a second viscous organic coating disposed on a second supporting film, said second opening having a form corresponding to said opening in the first organic coating;

applying said second viscous organic coating having said second opening to said surface of the substrate so that said second opening registers with said resistive heater, and removing said second supporting film and leaving said viscous organic coating on said resistive heater;

filling said second opening with a second thick film paste material including an electrically resistive material; and heating said second viscous organic coating and said second thick film paste material, thereby burning and removing said viscous organic coating and sintering and converting said second thick film paste material into a second resistive heater superposed on the first resistive heater.

2. A method of manufacturing a thermal head as claimed in claim 1, wherein said second opening has a smaller cross-sectional area than the first opening.

3. A method of manufacturing a thermal head as claimed in claim 1, wherein the electrical resistance of the first resistive heater is greater than the electrical resistance of the second resistive heater.

4. A method of manufacturing a thermal head, comprising the steps of:

depositing an electrically conductive layer on a surface of an insulating substrate;

depositing an organic film on the electrically conductive layer deposited on the substrate;

selectively removing said organic film from said electrically conductive layer, leaving a plurality of organic film strips on said electrically conductive layer;

selectively etching and removing the portion of said electrically conductive layer which is not covered by said organic film strips, thereby leaving a plurality of electrically conductive strips on which said organic film strips are superimposed and forming thereby a plurality of recesses between said electrically conductive strips;

filling said recesses with a thick film paste material including an insulating material;

heating said organic film strips and said thick film paste material, thereby burning and removing said organic film strips and sintering and converting said thick film paste material into insulator projections integral with said substrate;

forming at least one opening of predetermined form in a viscous organic coating disposed on a supporting film, applying said viscous organic coating having said opening to said surface of the substrate having thereon said projections and electrically conductive strips with said opening over at least part of said strips, and removing said supporting film and leaving said viscous organic coating on said substrate;

filling said opening with a second thick film paste material including an electrically resistive material;

heating said viscous organic coating and said second thick film paste material, thereby burning and removing said viscous organic coating and sintering and coverting said second thick film paste material into a resistive heater.

* * * * *